US007695233B2

(12) United States Patent
Toshima

(10) Patent No.: US 7,695,233 B2
(45) Date of Patent: Apr. 13, 2010

(54) SUBSTRATE PROCESSING APPARATUS

(75) Inventor: Masato Toshima, Saratoga, CA (US)

(73) Assignee: Orbotech LT Solar, LLC., San Jose, CA (US)

( * ) Notice: Subject to any disclaimer, the term of this patent is extended or adjusted under 35 U.S.C. 154(b) by 557 days.

(21) Appl. No.: 11/477,931

(22) Filed: Jun. 30, 2006

(65) Prior Publication Data

US 2007/0207014 A1 Sep. 6, 2007

(30) Foreign Application Priority Data

Mar. 4, 2006 (JP) ............................ 2006-058769

(51) Int. Cl.
C23F 1/08 (2006.01)
(52) U.S. Cl. .................. 414/217; 156/345.23
(58) Field of Classification Search ................ 414/217, 414/935, 411, 222.09, 222.11; 156/345.23
See application file for complete search history.

(56) References Cited

U.S. PATENT DOCUMENTS

| | | | | |
|---|---|---|---|---|
| 4,643,629 A | * | 2/1987 | Takahashi et al. | 414/331.17 |
| 5,084,125 A | * | 1/1992 | Aoi | 156/345.31 |
| 5,167,922 A | * | 12/1992 | Long | 422/58 |
| 5,486,080 A | * | 1/1996 | Sieradzki | 414/217 |
| 5,944,940 A | * | 8/1999 | Toshima | 156/345.29 |
| 6,007,675 A | * | 12/1999 | Toshima | 156/345.32 |
| 6,361,648 B1 | * | 3/2002 | Tobin | 156/345.1 |
| 6,517,691 B1 | * | 2/2003 | Bluck et al. | 204/298.25 |
| 6,719,517 B2 | * | 4/2004 | Beaulieu et al. | 414/217 |
| 6,821,563 B2 | * | 11/2004 | Yudovsky | 427/248.1 |
| 6,849,555 B2 | * | 2/2005 | Lee et al. | 438/715 |
| 6,902,647 B2 | * | 6/2005 | Hasper | 156/345.31 |
| 7,010,388 B2 | * | 3/2006 | Mitchell et al. | 700/218 |
| 7,214,027 B2 | * | 5/2007 | Stone | 414/805 |
| 2003/0113187 A1 | * | 6/2003 | Lei et al. | 414/217 |
| 2008/0138175 A1 | * | 6/2008 | Mitchell et al. | 414/217 |

* cited by examiner

*Primary Examiner*—Charles A Fox
(74) *Attorney, Agent, or Firm*—Nixon Peabody LLP; Joseph Bach

(57) ABSTRACT

The substrate processing apparatus is capable of highly efficiently feeding and carrying out work and improving production efficiency. The substrate processing apparatus comprises: a processing chamber including a processing stage; a first load lock chamber for feeding the work, the first load lock chamber being communicated to the processing chamber; a second load lock chamber for carrying out the work, the second load lock chamber being communicated to the processing chamber; a first buffer storage being located between the processing chamber and the first load lock chamber, the first buffer storage storing the work to be transferred therebetween; and a second buffer storage being located between the processing chamber and the second load lock chamber, the second buffer storage storing the work to be transferred therebetween.

14 Claims, 5 Drawing Sheets

SUBSTRATE PROCESSING APPARATUS

BACKGROUND OF THE INVENTION

The present invention relates to a substrate processing apparatus, which processes substrates, e.g., semiconductor wafers, solar battery panels.

In ordinary methods of producing electronic devices, e.g., semiconductor wafers, solar battery panels, a step of forming films by chemical vapor deposition, etc. and a step of plasma etching are performed as ordinary processing steps. The inventor of the present invented an apparatus which is capable of continuously performing the steps so as to process flat works, e.g., semiconductor wafers (see U.S. Pat. No. 6,007,675). The apparatus is shown in FIG. 6. The apparatus comprises a processing chamber 20, in which plasma-vapor deposition is performed to works 10, e.g., semiconductor wafers, and load lock chambers 22 and 24, which are connected to the processing chamber 20 so as to feed the works 10 into and carry out them from the processing chamber 20.

The processing chamber 20 includes six stages A-F. The stage B, which faces the load lock chamber 22, and the stage A, which faces the load lock chamber 24, are used as stages for transferring the works 10; the stages C-F are used as processing stages.

Six rotary arms 26, which support the works 10 set in each of the stages, and a rotating mechanism, which intermittently circularly moves the rotary arms 26, between the stages, in one direction (in the clockwise direction in FIG. 6), are provided in the processing chamber 20. The rotating mechanism includes an elevating mechanism, which vertically moves the rotary arms 26 between an upper position (a conveying position for conveying the works 10), which is located above setting plates of the stages, and a lower position (an evacuating position for setting the works 10 onto the setting plates), which is located under the setting plates.

The load lock chamber 22 stores the works 10 to be fed into the processing chamber 20; the load lock chamber 24 stores the works 10 processed in the processing chamber 10. A holders 28, in which many works 10 are vertically arranged with narrow spaces, are set in the load lock chambers 22 and 24. In the holder 28, a plurality of supporting bars 28a are vertically arranged at regular intervals. Each of the works 10 can be sidewardly putted into and taken out from each of the supporting bars 28a. The holder 28 is synchronously moved, in the vertical direction, with feeding and carrying out the works 10, by a lift mechanism.

Open-close plates 30 are respectively provided to openings of the load lock chambers 22 and 24, through which the works 10 are fed and carried out. Gate valves 32 are respectively provided between the processing chamber 20 and the load lock chambers 22 and 24.

In the apparatus shown in FIG. 6, the open-close plate 30 of the load lock chamber 22 is opened, and the works 10 are supplied to the holder 28 set in the load lock chamber 22. Then, the open-close plate 30 is closed, and inner pressure of the load lock chamber 22 is reduced. When the load lock chamber 22 reaches prescribed degree of vacuum, the gate valve 32 is opened so as to feed the works 10 into the processing chamber 20. A transferring mechanism, which has a hand 34 for transferring the works 10 between the load lock chamber 22 and the processing chamber 20, is provided in the processing chamber 20. The transferring mechanism takes out the works 10, one by one, from the holder 28 of the load lock chamber 22 and transfers them to the processing stage B of the processing chamber 20.

In the load lock chamber 24, the processed works 10, which have been conveyed to the stage A, are transferred to the holder 28, which are set in the load lock chamber 24, one by one, by a hand 36.

The action of feeding the works 10 from the load lock chamber 22 and the action of conveying the works 10 from the stage A to the load lock chamber 24 are synchronously performed with the processes performed in the stages C-F of the processing chamber 20. Namely, the work 10 fed to the stage B is processed in the stages C-F, then conveyed from the stage A to the load lock chamber 24.

In the apparatus having the processing chamber 20 and the load lock chambers 22 and 24, the works 10 are sequentially fed to the processing chamber 20, and the processed works 10 are also sequentially carried out, so that a plurality of the processes can be efficiently performed.

When all of the works 10, which have been fed to the load lock chamber 22, are processed, the works 10 are newly fed to the load lock chamber 22 and the processed works 10 are carried out from the load lock chamber 24. However, it takes a long time to exchange the works 10 in the load lock chambers 22 and 24.

In a typical case, a total time to exchange the works 10 in the load lock chamber 22 is about 100 seconds. The time length includes: (1) 20 seconds to return the inner pressure of the load lock chamber 22 to the atmospheric pressure; (2) 30 seconds to feed and carry out the works 10; and (3) 50 seconds to close the load lock chamber 22 and reduce the inner pressure thereof.

On the other hand, it takes several seconds to 10 seconds to perform the processes in the processing stages of the processing chamber 20. For example, it takes about 360 seconds to completely plasma-process 25 semiconductor wafers. According to the time of plasma-processing, i.e., 360 sec., and the time of exchanging (feeding and carrying out) the works 10, i.e., 100 sec., the time of exchanging the works 10 accounts for about 20% of the total processing time.

By shortening the time of processing the works 10 in each of the processing stages, the time of exchanging the works 10 highly influences production efficiency. To improve the production efficiency, it is very important to highly efficiently feed and carry out the works 10.

SUMMARY OF THE INVENTION

The present invention was conceived to solve the above described problems.

An object of the present invention is to provide a substrate processing apparatus, which is capable of highly efficiently feeding and carrying out a work and improving production efficiency.

To achieve the object, the present invention has following structures.

Namely, the substrate processing apparatus of the present invention comprises:

a processing chamber including a processing stage, in which a work is processed;

a first load lock chamber for feeding the work, the first load lock chamber being communicated to the processing chamber;

a second load lock chamber for carrying out the work, the second load lock chamber being communicated to the processing chamber;

a first buffer storage being located between the processing chamber and the first load lock chamber, the first buffer storage storing the work to be transferred therebetween; and a second buffer storage being located between the processing chamber and the second load lock chamber, the second buffer storage storing the work to be transferred therebetween.

In the substrate processing apparatus, each of the load lock chambers may have a first open-close plate, which is opened when the work is fed into and carried out from the load lock chamber and which is air-tightly closed when inner pressure of the load lock chamber is reduced, and a second open-close plate may be provided between each of the load lock chambers and each of the buffer storages, the second open-close plate is opened when the load lock chamber reaches prescribed degree of vacuum so as to convey the work between the load lock chamber and the buffer storage. With this structure, the work can be fed to and carried out from the load lock chambers, and the inner pressure of the load lock chambers can be reduced.

In the substrate processing apparatus, the first load lock chambers may have means for heating the work and/or means for cooling the work. With this structure, the work can be efficiently heated and/or cooled.

In the substrate processing apparatus, a holder, which holds a plurality of works, may be respectively set in the load lock chambers and the buffer storages, and the substrate processing apparatus may further comprise means for collectively conveying the works between the holder of each of the load lock chambers and the holder of each of the buffer storages.

In the substrate processing apparatus, a holder, which holds a plurality of works, may be respectively set in the load lock chambers and the buffer storages, each of the buffer storages may have a mechanism for elevating the holder, and the substrate processing apparatus may further comprise a mechanism for transferring the works between the holder, which is supported by the elevating mechanism, and a transferring stage of the processing chamber.

In the substrate processing apparatus, the transferring mechanism may include a hand, which is reciprocally moved between each of the buffer storages and the transferring stage, or the transferring mechanism may include: a first arm transferring the works between the first buffer storage and the first buffer storage; and a second arm transferring the works between the second buffer storage and the second transferring stage.

In the substrate processing apparatus, the work may be held by a carrier, and the work may be conveyed and transferred together with the carrier.

In the substrate processing apparatus, a planar shape of the carrier may be formed into a trapezoid, and the carrier may be transferred into the processing chamber with a narrow side of the carrier facing the center of the processing chamber.

In the substrate processing apparatus, a solar battery panel can be effectively processed as the work.

In the substrate processing apparatus, the processing chamber may include the processing stage for processing the work and a transferring stage for transferring the work, and the work may be moved between the processing stage and the transferring stage by moving means, which includes rotary arms, whose number is equal to that of the stages, and a mechanism for rotating the rotary arms.

In the substrate processing apparatus, the rotating mechanism may include an elevating mechanism, which moves the rotary arms between an upper position, which is located above setting plates of the stages for conveying the work, and a lower position, which is located under the setting plates for setting the work onto the setting plates.

In the substrate processing apparatus, the processing chamber may include the processing stage for processing the work and a transferring stage for transferring the work, and the work may be moved between the processing stage and the transferring stage by moving means, which includes a turn table for supporting the work and a mechanism for rotating the turn table.

In the substrate processing apparatus, pins may be provided to the turn table, and the pins may be collectively moved between upper positions, at which the pins are upwardly projected from the turn table to support the work for transferring the work, and lower positions, at which the pins are retracted in the turn table for setting the work, by an elevating mechanism.

In the substrate processing apparatus of the present invention, the buffer storages are respectively provided between the processing chamber and the load lock chambers, so a next work can be waited in the load lock chamber until the work is processed in the buffer storage and the processing chamber. Further, the load lock chamber and the buffer storage can be communicated when the work is ready to be carried out. Therefore, when the transfer of the work is completed in the load lock chamber, the work waiting in the load lock chamber can be transferred to the buffer storage, so that the time of exchanging the works can be efficiently shortened.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

First Embodiment

Figure 1:
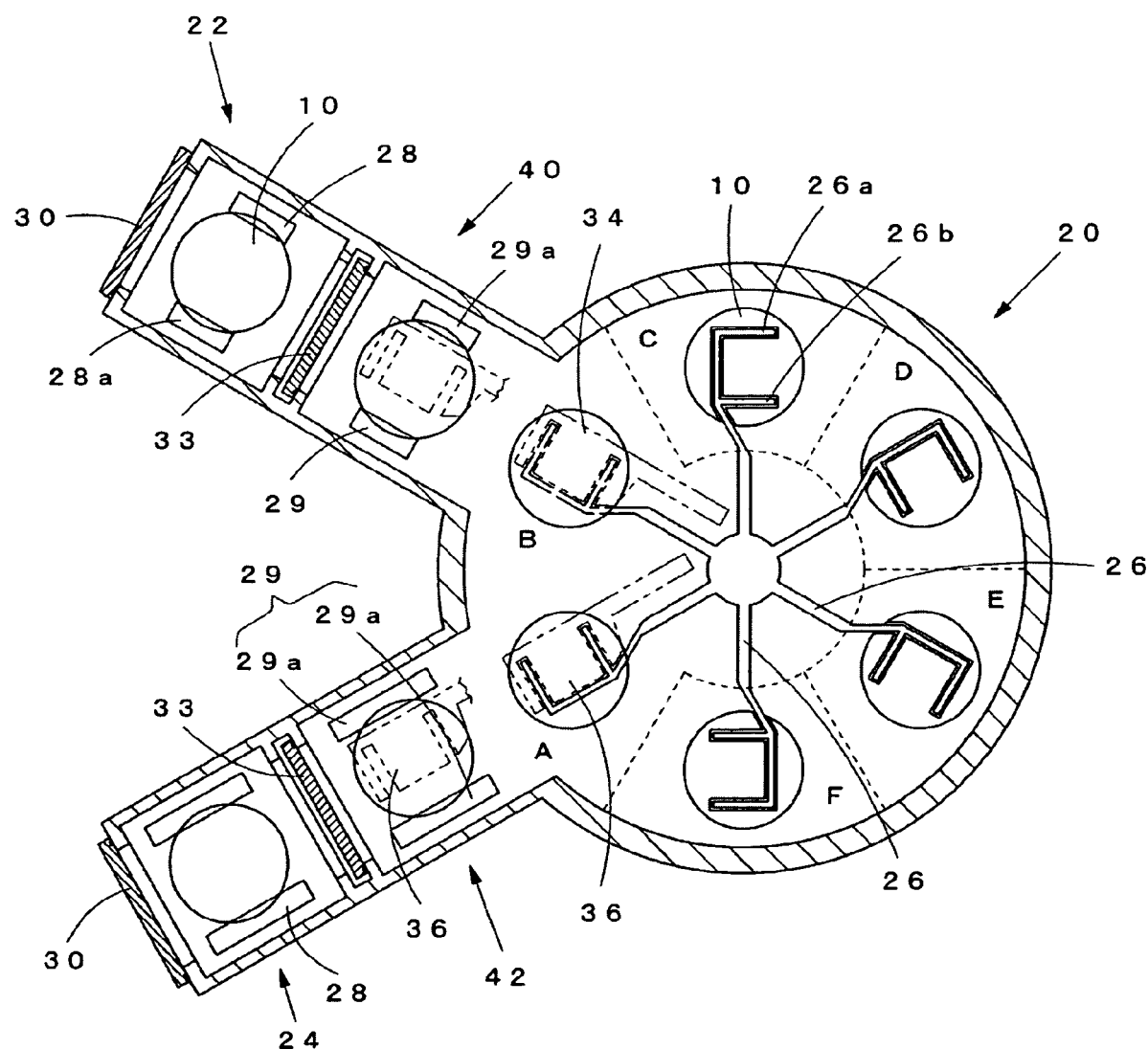
FIG. 1 is a plan sectional view of the substrate processing apparatus of a first embodiment.
Figure 6:
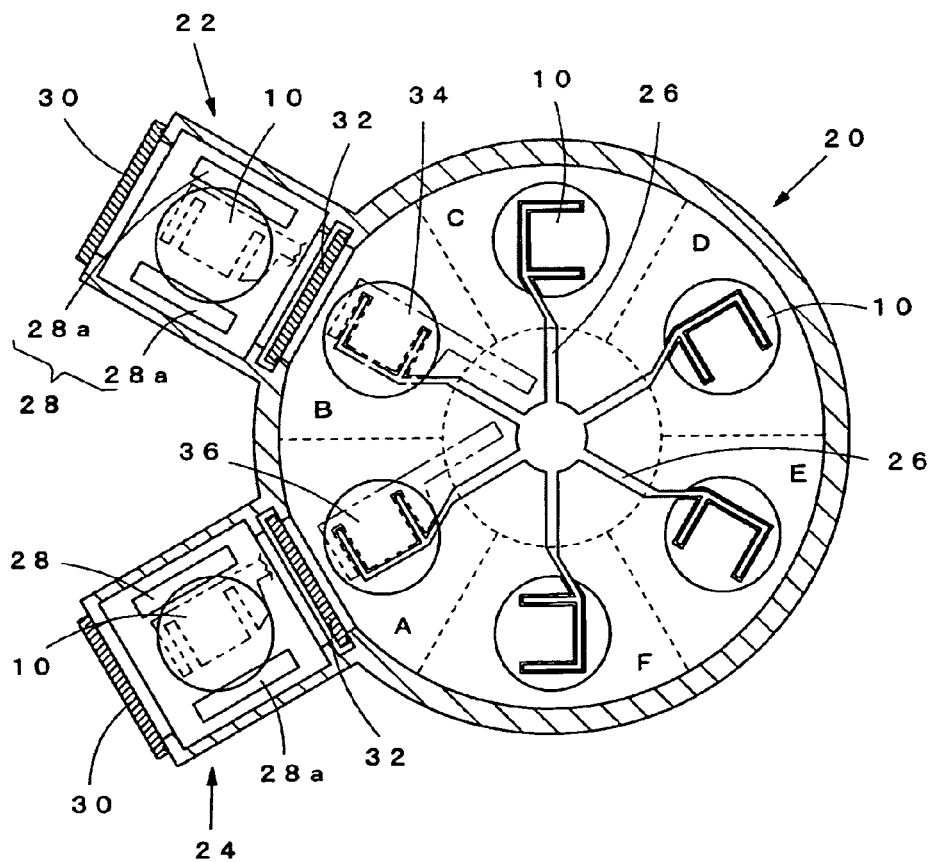
FIG. 6 is a plan sectional view of the conventional substrate processing apparatus.

FIG. 1 is a plan sectional view of the substrate processing apparatus of a first embodiment. The apparatus of the present embodiment processes semiconductor wafers 10 as works. Basic structures of the apparatus is the same as that of the conventional apparatus shown in FIG. 6. Unlike the conventional apparatus shown in FIG. 6, the apparatus of the present embodiment has buffer storages 40 and 42, which are respectively provided between a processing chamber 20 and the load lock chambers 22 and 24.

The buffer storages 40 and 42 accommodate holders 28, in each of which the works 10 are supported. The holders 28 are vertically moved in the buffer storages 40 and 42. Further, the works 10 are transferred by hands 34 and 36.

Connecting sections between the processing chamber 20 and the buffer storages 40 and 42 are opened. On the other hand, second open-close plates 33 are respectively provided between the buffer storages 40 and 42 and the load lock chambers 22 and 24. Open-close plates 30 are respectively provided to openings of the load lock chambers 22 and 24, through which the works 10 are fed and carried out, as well as the conventional apparatus shown in FIG. 6.

In the processing chamber 20, six stages A-F are arranged, in the circumferential direction, at regular intervals. The stages A and B are used for transferring the works 10; the stages C-F are used for processing the works 10, e.g., plasma-vapor deposition.

A sub-processing chamber is provided to each of the processing stages C-F. For example, a high-frequency generator, which applies high-frequency waves to the work 10, a gas supplying unit, which supplies a gas for forming films or etching, and a gas discharging unit are provided to each of the sub-processing chambers. The structures of the sub-processing chambers are not limited.

In each of the sub-processing chambers, the work 10 is set onto a setting plate, which is provided in a lower part of the sub-processing chamber and which acts as a heater, and processed thereon. The setting plate has a slit, so that a pair of supporting bars 26a and 26b of each rotary arm 26, which support the work 10, are not interfered with the setting plate when the work 10 is conveyed by rotating the rotary arm 26. Namely, the work 10 is set on the setting plate and processed in a retracted state, in which the rotary arm 26 has been moved downward and the supporting bars 26a and 26b are located under the slit. After completing the process, the rotary arm 26 is moved upward together with the supporting bars 26a and 26b so as to convey the work 10.

Next, the steps of processing the works 10 will be explained.

Firstly, the works 10 are fed to the holder 28, which has been set in the load lock chamber 22. The works 10 are sidewardly inserted into the holder 28 and respectively mounted onto the supporting bars 28a.

After the works 10 are fed to the holder 28 in the load lock chamber 22, the open-close plate 30 is closed, then inner pressure of the load lock chamber 22 is reduced. The open-close plate 30 air-tightly seals the load lock chamber 22 from outside. When the load lock chamber 22 reaches prescribed degree of vacuum, a second open-close plate 33 is opened so as to convey the works 10 from the holder 28 in the load lock chamber 22 to a holder 29 in the buffer storage 40. The works 10 stored in the holder 28 in the load lock chamber 22 is collectively conveyed to the holder 29 in the buffer storage 40 by a slider.

After the works 10 are conveyed to the holder 29 in the buffer storage 40, the second open-close plate 33 is closed, then the inner pressure of the load lock chamber 22 is returned to the atmospheric pressure so as to feed new works 10 to the holder 28 in the load lock chamber 22. After the new works 10 are fed to the holder 28, the open-close plate 30 is closed to reduce the inner pressure of the load lock chamber 22.

When the load lock chamber 22 reaches the prescribed degree of vacuum, the second open-close plate 33 is opened. In this state, the works 10 are ready to be fed to the buffer storage 40.

An elevating mechanism, which is capable of vertically moving the holder 29, is provided in the buffer storage 40. The works 10 are conveyed from the holder 28 to the processing chamber 20 by the elevating mechanism, which vertically moves the holder 29, and a hand 34, which is reciprocally moved between the buffer storage 40 and the stage B.

When the hand 34 enters the buffer storage 40 and the work 10 is transferred from a supporting bar 29a to the hand 34, a height of the hand 34 is the same as that of the setting plate of each stage in the processing chamber 20. The hand 34 is returned to the stage B in that state.

When the hand 34 reaches the stage B, the rotary arm 26 is located at a lower position under the hand 34. As described above, the hand 34 has the slit, through which the supporting bars 26a and 26b of the rotary arm 26 pass. Therefore, by moving the rotary arm 26 from the lower position to an upper position, the work 10 can be transferred from the hand 34 to the rotary arm 26 and conveyed.

In FIG. 1, the work 10 is conveyed by turning the rotary arm 26 to the adjacent stage by a rotary mechanism. When the rotary arms 26 are moved to the upper position to convey the works 10, the works 10 set on the stages are supported by the supporting bars 26a and 26b of the rotary arms 26, then the rotary arms 26 are turned to convey the works 10 to the next stages. Upon reaching the next stages, the rotary arms 26 are downwardly moved to the lower positions, so that the works 10 are respectively transferred onto the setting plates from the supporting bars 26a and 26b. When the works 10 are transferred, one step of conveying the works 10 is completed.

The work 10 on the stage F is transferred, by the rotary arm 26, to the stage A for carrying out. At the stage A, the work 10 is transferred to the rotary arm 26 to the hand 36, the hand 36 holding the work 10 enters the buffer storage 42, and the processed work 10 is transferred to the holder 29 set in the buffer storage 42.

In the buffer storage 42, the holder 29, which includes supporting bars 29a, is vertically moved constant distance in one movement. The constant distance is equal to a height of the supporting bars 29a, which are vertically arranged in the holder 29. The works 10 are inserted into the vacant supporting bars 29a, by the hand 36, in order. If the holder 29 is initially located at the uppermost position, the holder 29 is moved downward step by step with the works 10 being set in all of the supporting bars 29a. On the other hand, if the 29 is initially located at the lowermost position, the holder 29 is moved upward step by step with the works 10 being set in all of the supporting bars 29a.

When the works 10 are transferred from the holder 29 to the hand 34 in the buffer storage 40 for feeding works, the works 10 are transferred by the same manner.

Upon transferring the works 10 to the holder 29 in the buffer storage 42, the processed works 10 in the holder 29 are transferred to the holder 28 in the load lock chamber 24. The processed works 10 are also collectively transferred from the holder 29 to the holder 28 by the slider.

When the works 10 are completely transferred to the holder 28, the second open-close plate 33 is closed, the inner pressure of the load lock chamber 24 is returned to the atmospheric pressure, and the open-close plate 30 is opened so as to carry out the works 10 from the holder 28 by a carry-out robot.

After the works 10 are carried out, the open-close plate 30 is closed, the inner pressure of the load lock chamber 24 is reduced until the load lock chamber 24 reaches the prescribed degree of vacuum, then the second open-close plate 33 is opened. With this action, the holder 28 in the load lock chamber 24 are ready to receive the new works 10.

As described above, when the works 10 are completely transferred from the holder 29 of the buffer storage 40, the new works 10 are fed to the holder 29 from the holder 28, which have waited in the load lock chamber 22. In the next feeding operation, the new works 10, which have been set in the holder 29, are fed to the processing chamber 20.

In the substrate processing apparatus of the present embodiment, before the works 10 are transferred between the holders 28 and 29, the load lock chambers 22 and 24 are communicated to the buffer storages 40 and 42 and the holders 28 of the load lock chambers 22 and 24 are in waiting states. With this action, a total time for feeding and carrying out the works 10 is a time for transferring the works 10 between the holders 28 and 29.

In the actual processing operation, the total time depends on number of storing the works 10 in the holder 28 and number of the processing stages. For example, it takes about 360 seconds to completely plasma-process 25 semiconductor wafers. Therefore, it is easy to make the works 10 ready to be transferred between the holders 28 and 29 within the process time.

On the other hand, number of the works 10 stored in the holders 28 and 29 may be defined on the basis of a time for making the works 10 ready to be transferred between the holders 28 and 29 and a time for processing one work 10.

In the present embodiment, the holders 28 in the load lock chambers 22 and 24 are made in the waiting states while the works 10 are processed. Therefore, it takes about 10 seconds to transfer the works 10 between the holders 28 and 29, so that the time for feeding and carrying out the works 10, which is about 100 seconds in the conventional apparatus, can be much shortened.

The rotary arms 26 are intermittently rotated at regular time intervals. The rotation speed is controlled on the basis of processing times of the processing stages. If the time intervals are long, the new works 10 can be completely transferred from the holder 28 to the holder 29 by the beginning of the rotation of the rotary arms 26 after the works 10 are transferred to the rotary arms 26. By employing this control, the works 10 can be continuously fed to the processing chamber 20 and processed without stopping the intermittent rotation of the rotary arms 26.

Even if the transferring the works 10 between the holders 28 and 29 is not completed by the beginning of the intermittent rotation of the rotary arms 26, the time for feeding the works 10 can be much shorter than that of the conventional apparatus.

When the works 10 are carried out, the works 10 are processed in the processing chamber 20 then carried out. Therefore, timing of transferring the works 10 is shifted a time for passing through the processing stages with respect to that for feeding the works 10.

The substrate processing apparatus of the present embodiment may be used for plasma-processing semiconductor wafers. In that case, lower electrodes and heaters are respectively fixed to the processing stages. The apparatus may have a simple structure with a low production cost. Further, the apparatus may be effectively applied to a plasma ashing device, whose electrode interval is relatively long, and a plasma CVD apparatus.

Second Embodiment

Figure 2:
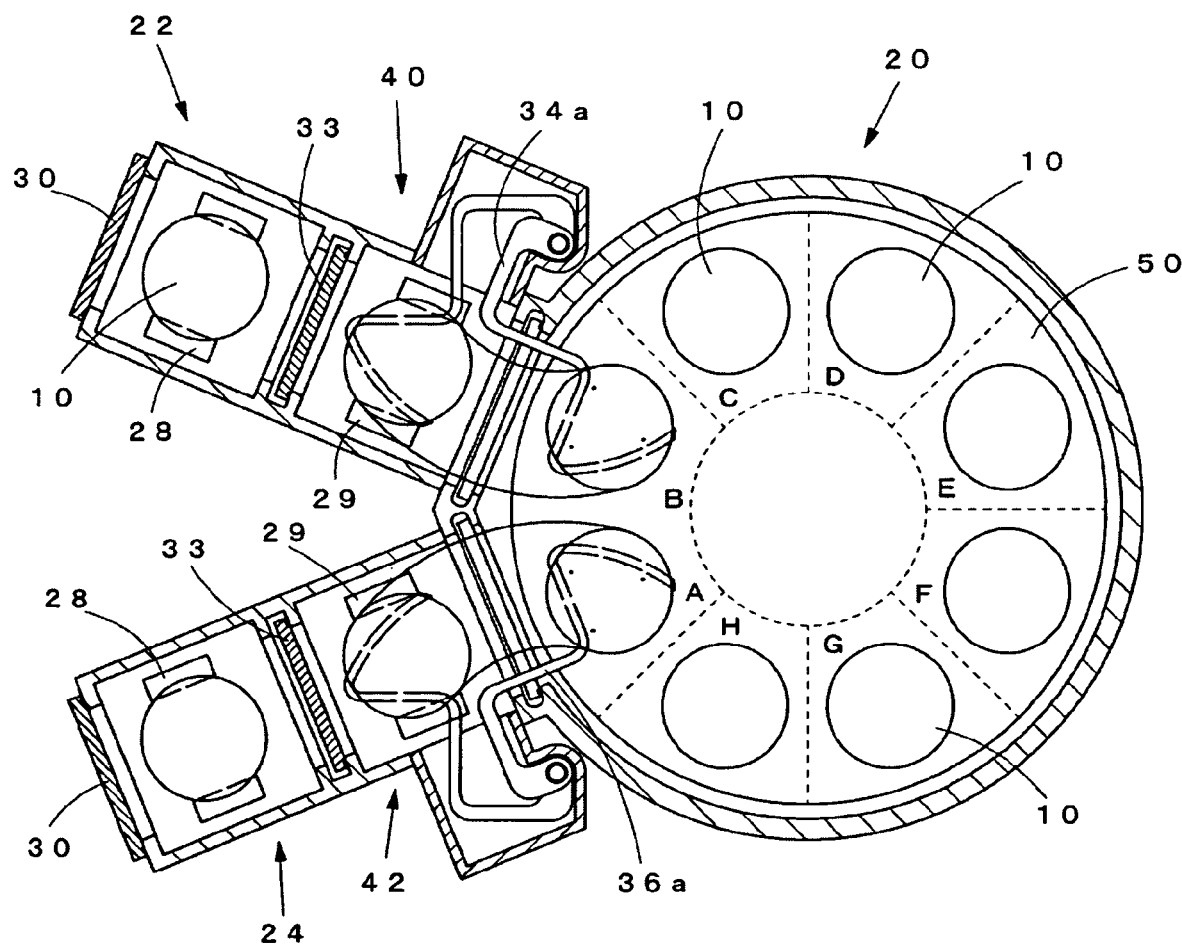
FIG. 2 is a plan sectional view of the substrate processing apparatus of a second embodiment.

A second embodiment will be explained with reference to FIG. 2. FIG. 2 is a plan sectional view of the substrate processing apparatus of the second embodiment. Note that, the structural elements explained in the first embodiment are assigned the same symbols, and explanation will be omitted. In the second embodiment, the works 10 are conveyed in the processing chamber 20 by a turn table 50.

The buffer storage 40 and the load lock chamber 22, which are used for feeding the works 10, are communicated to the processing chamber 20, and the buffer storage 42 and the load lock chamber 24, which are used for carrying out the works 10, are communicated to the processing chamber 20 as well as the first embodiment.

Eight stages A-H are provided in the processing chamber 20. The stages A and B are used for transferring the works 10; the stages C-H are used for processing the works 10. In each of the stages A-H, three supporting pins for supporting the work 10 are vertically moved, by an elevating mechanism, between upper positions and lower positions.

When the supporting pins are projected from a surface of the turn table 50, the works 10 can be transferred.

A feeding arm 34a, which transfers the work 10 from the holder 29 onto the stage B of the turn table 50, is provided adjacent to the buffer storage 40. The work 10 held by the holder 29, which is set in the buffer storage 40, is supported by an end part of the feeding arm 34a. The feeding arm 34a is turned until the work 10 reaches a position above the stage B, then the work 10 is transferred to the supporting pins of the stage B. The supporting pins, which support the work 10, is moved downward, by the elevating mechanism, so as to set the work 10 onto the surface of the turn table 50.

The work 10 is set on a setting section (or a heating plate) of the turn table 50. By intermittently rotating the turn table 50, the work 10, which has been set on the heating plate, is conveyed to the stages in order, so that the work 10 can be completely processed.

When the turn table 50 is turned and the work 10 is conveyed from the stage H to the transferring stage A, the supporting pins are moved upward, so that the work 10 is supported at a position above the surface of the turn table 50.

A carry-out arm 36a, which carries out the work 10, is provided adjacent to the buffer storage 42. The carry-out arm 36a is turned between the stage A and the holder 29, which is set in the buffer storage 42, so as to transfer the processed work 10 from the stage A to the holder 29.

The holders 29 in the buffer storages 40 and 42 are vertically moved so as to transfer the work 10 from the holder 29 to the stage B and transfer the processed work 10 from the stage A to the holder 29 as well as the first embodiment.

Further, the works 10 are conveyed between the holder 29 in the buffer storage 40 and the holder 28 in the load lock chamber 22, and the works 10 are conveyed between the holder 29 in the buffer storage 42 and the holder 28 in the load lock chamber 24 as well as the first embodiment.

In the present embodiment, the works 10 are conveyed between the processing stages by the turn table 50, and the buffer storages 40 and 42 are used to make the holders 28 wait. Therefore, the works 10 can be highly efficiently fed and carried out as well as the first embodiment, so that production efficiency highly improved.

In the apparatus of the present embodiment, electrode interval can be relatively short, and reaction chambers of the processing stages can be easily insulated, so the apparatus can be suitably applied to a plasma CVD apparatus, which can be precisely controlled.

Third Embodiment

Figure 3:
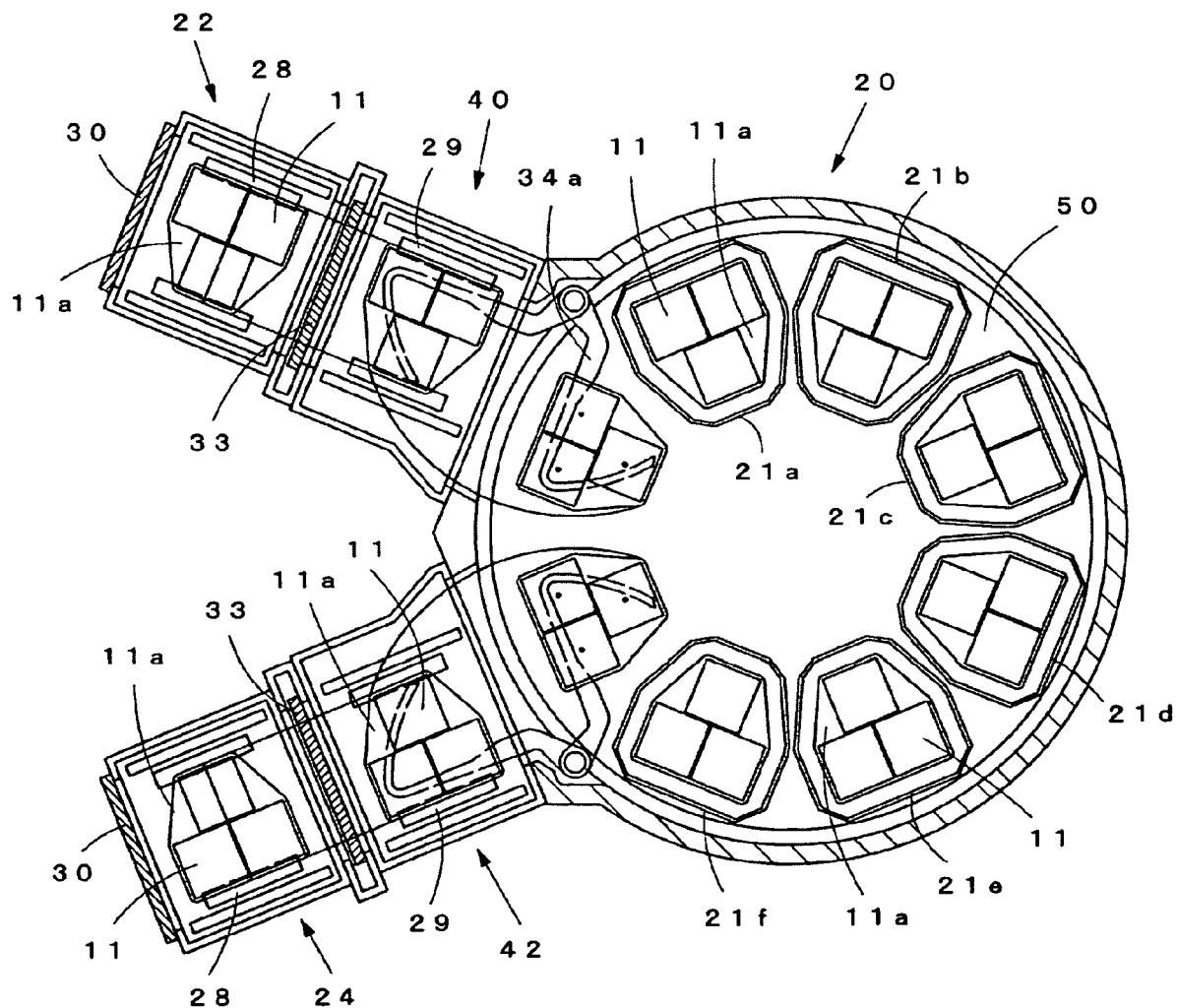
FIG. 3 is a plan sectional view of the substrate processing apparatus of a third embodiment.

A third embodiment will be explained with reference to FIG. 3. FIG. 3 is a plan sectional view of the substrate processing apparatus of the third embodiment. Note that, the structural elements explained in the former embodiments are assigned the same symbols, and explanation will be omitted.

In the third embodiment, the substrate processing apparatus is applied to produce solar battery panels.

In the apparatus, works 11 are conveyed in the processing chamber 20 by the turn table 50. Six reaction chambers 21a-21f are formed in the processing chamber 20. The stages A and B are used for transferring the works 11. The stages A and B and the reaction chambers 21a-21f are arranged, in the circumferential direction, at regular intervals.

Three works 11 are set on each carrier 11a and fed into the processing chamber 20 together with the carrier 11a. In the processing chamber 20, a narrow part of each carrier 11a is headed for a center of the processing chamber 20.

The buffer storages 40 and 42 and the load lock chambers 22 and 24 are communicated to the processing chamber 20 as well as the former embodiments. The feeding arm 34a transfers the works 11 from the holder 29 of the buffer storage 40 onto the turn table 50 together with the carrier 11a, and the carry-out arm 36a transfers the processed works 11 from the turn table 50 to the holder 29 of the buffer storage 42 together with the carrier 11a as well as the second embodiment.

The supporting pins, which are capable of supporting the carrier 11a above the surface of the turn table 50, are provided in each stage of the turn table 50. The supporting pins are vertically moved by the elevating mechanism. In each of the transfer stages A and B, when the works 11 are transferred together with the carrier 11a, the carrier 11a is supported by the supporting pins which are upwardly projected from the surface of the turn table 50.

After the carrier 11a is transferred to the supporting pins by the feeding arm 34a, the supporting pins are moved downward, so that the carrier 11a can be set on the surface of the turn table 50.

In the stage A, the carrier 11a, which is supported at the upper position by the supporting pins, is transferred to the holder 29 set in the buffer storage 42, by the carry-out arm 36a, together with the processed works 11.

In the present embodiment too, the buffer storages 40 and 42 are provided between the processing chamber 20 and the load lock chambers 22 and 24, so that works 11 can be highly effectively transferred together with the carriers 11a. To produce solar battery panels, extremely high production efficiency is required. Therefore, the substrate processing apparatus of the present embodiment can be effectively used.

Further, proper heating means, e.g., hot plate, infrared ray lamp, induction heating coil, may be provided in the load lock chamber 22 so as to preheat the works 11. On the other hand, proper cooling means, e.g., cooling plate, may be provided in the load lock chamber 24 so as to cool the processed works 11. The heating means may be provided in the buffer storage 40, and the cooling means may be provided in the buffer storage 42.

Fourth Embodiment

Figure 4:
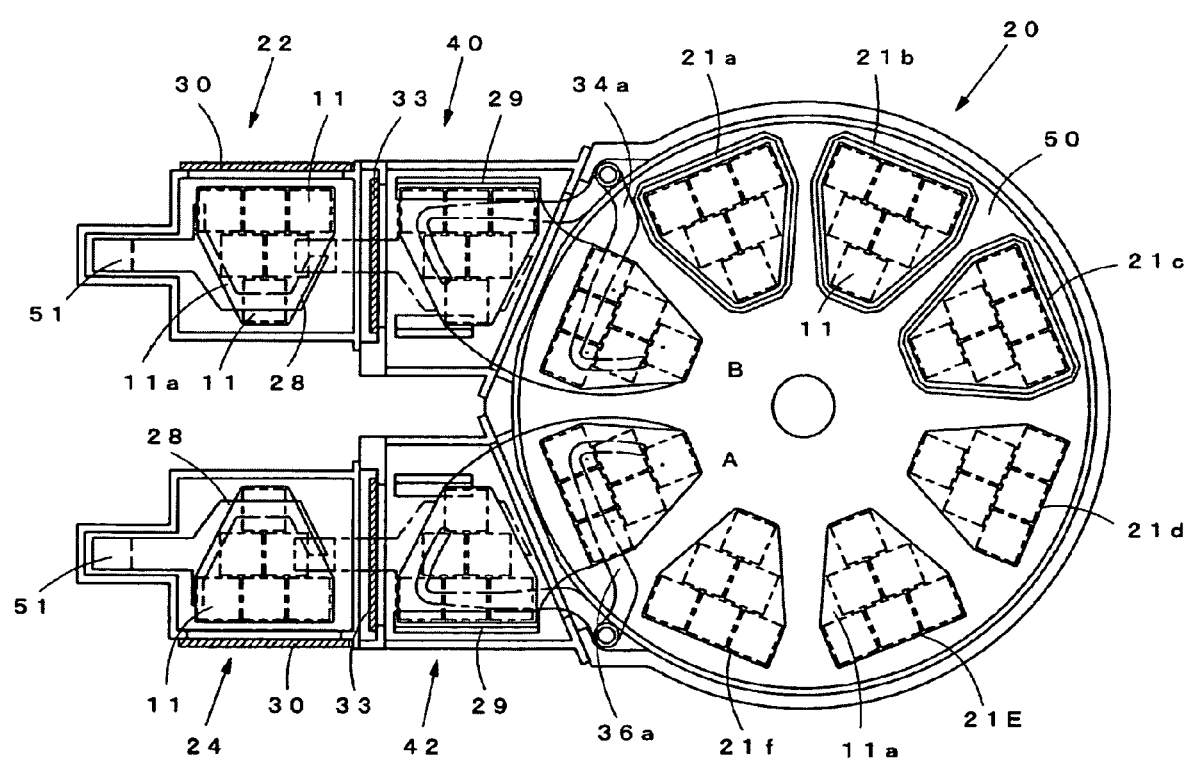
FIG. 4 is a plan sectional view of the substrate processing apparatus of a fourth embodiment.
Figure 5:
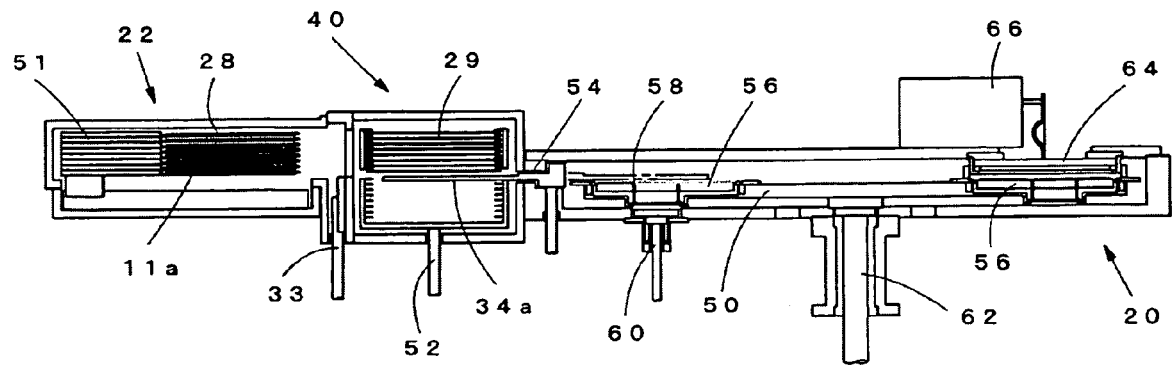
FIG. 5 is a side sectional view of the substrate processing apparatus of the fourth embodiment.

A fourth embodiment will be explained with reference to FIGS. 4 and 5. FIG. 4 is a plan sectional view of the substrate processing apparatus of the fourth embodiment; FIG. 5 is a side sectional view thereof. Note that, the structural elements explained in the former embodiments are assigned the same symbols, and explanation will be omitted. In the fourth embodiment too, the substrate processing apparatus is applied to produce solar battery panels.

The basic structure of the apparatus is the same as that of the third embodiment. The carriers 11a are used in the third embodiment too. However, the works 11 in the present embodiment are smaller than those of the third embodiment, so six works 11 are mounted on each of the carriers 11a.

A planar shape of the carrier 11a is formed into a trapezoid. In the processing chamber 20, the narrow part of each carrier 11a is headed for the center of the processing chamber 20, so that the square-shaped solar battery panels 11 can be collectively conveyed and efficiently processed. The shapes of the reaction chambers 21a-21f are corresponded to the planar shape of the carrier 11a, so that the reactions chambers 21a-21f are formed in the processing chamber 20 without dead spaces.

In the present embodiment, a combination of the buffer stage 40 and the load lock chamber 22, which is connected to the processing chamber 20, and another combination of the buffer stage 42 and the load lock chamber 24, which is also connected to the processing chamber 20, are arranged parallel. Further, the open-close plates 30 of the load lock chambers 22 and 24 are provided to side walls of the chambers 22 and 24. Namely, the works 11 are fed to the holder 28 of the load lock chamber 22 and carried out from the holder 28 of the load lock chamber 24 in the direction perpendicular to the direction of conveying the carriers 11a. Sliders 51, which transfer the works 11 between the holders 28 and the holders 29, are respectively provided in the load lock chambers 22 and 24.

FIG. 5 is the side sectional view of the load lock chamber 22, the buffer storage 40 and the processing chamber 20.

The holder 28 is provided in the load lock chamber 22, and the slider 51 is provided close to the holder 28. The slider 51 has a plurality of supporting plates, each of which corresponds to each carrier 11a held by the holder 28.

In the buffer storage 40, the holder 29, which holds the carriers 11a together with the works 11, is vertically moved by an elevating mechanism 52.

As shown in FIG. 5, when the elevating mechanism 52 locates the holder 29 at an upper position, the slider 51 is moved to enter the buffer storage 40 with the supporting plates supporting the carriers 11a, so that the works 11 can be transferred from the holder 28 to the holder 29.

The buffer storage 40 and the processing chamber 20 are always communicated via a communication port 54, the carrier 11a accommodated in the holder 29 is supported by the feeding arm 34a, and the feeding arm 34a is turned until reaching the stage B of the processing chamber 20, so that the carrier 11a can be transferred to a setting section of the turn table 50. By combining the turning action of the feeding arm 34a and the intermittent downward movement of the holder 29, the carriers 11a can be transferred from the holder 29 to the feeding arm 34a in order.

Elevating mechanisms 60, each of which has supporting pins 58, are respectively provided to the stages A and B of the turn table 50. When the supporting pins 58 are upwardly projected from heating plates 56, the carriers 11a are transferred between the stages A and B and the buffer storages 40 and 42.

The turn table 40 is rotated by a rotating mechanism 62 so as to convey the carriers 11a together with the works 11, and the works 11 are processed in each of the processing stages. In FIG. 5, a symbol 64 stands for an upper electrode, and a symbol 66 stands for a high-frequency wave generator.

In FIG. 4, the reaction chambers 21a-21c in the processing chamber 20 used for preheating the works 11; the reaction chambers 21d-21f are used for plasma-processing the works 11.

In the present embodiment too, the buffer storages 40 and 42 are provided, so that the carriers 11a can be highly effectively transferred together with the works 11. Efficiency of processing the works 11 can be highly improved.

As described in the above described embodiments, the substrate processing apparatus of the present invention is capable of efficiently feeding the works from the buffer storages 40 to the processing chamber 20 and efficiently carrying out the processed works from the processing chamber 20. Therefore, following operation modes (1)-(3) can be performed.

(1) Continuous Mode: The works are continuously fed, processed and carried out with maintaining synchronous intermittent rotations of the rotary arms 26 and the turn table 50. In this mode, the efficiency of processing works can be maximized.

(2) Batch Mode: Feeding the works is once stopped when the works are fed to all of the processing stages of the processing chamber 20. Then, the works are processed and all of the processed works are carried out. Upon carrying out all of the processed works, one cycle of processing the works is terminated.

(3) Cyclical Mode: This mode is similar to the batch mode. In the batch mode, the turn table 50 is stopped while the works are processed. On the other hand, in case of processing the works in a short time, e.g., 10-100 msec., the works can be processed with the turn table 50 rotating at fixed speed. Further, if processing time of the sub-processing chambers or the reaction chambers are different, the rotation and the stop of turn table 50 are suitably controlled on the basis of the processing time. This sequence of processing works is particularly useful for producing advanced films such as low dielectric constant (low-k) and high dielectric constant (high-k) films used for semiconductor devices. Such low-k and high-k film production often require processing the works in short time and different processing condition sequencially (one example is processing "deposition" for 250 msec, then processing "etching" for 150 msec and finally processing "annealing" for 200 msec, and repeat the sequence for several hondred times) In this sequemcial process, the works can be processed with the turn table 50 rotating at fixed speed with different upper process stage arc length (in obove example, "deposition" has 500 mm arc length process stage, "etching" has 300 mm process stage and "annealing" has 400 mm process stage) corresponding to the each processing time.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A substrate processing apparatus, comprising:
   a processing chamber including a plurality of stages, including a processing stage in which a work is processed, the plurality of stages arranged at regular intervals in a circumferential direction;
   a first load lock chamber for feeding the work, said first load lock chamber being communicated to said processing chamber;
   a second load lock chamber for carrying out the work, said second load lock chamber being communicated to said processing chamber;
   a first buffer storage being located between said processing chamber and said first load lock chamber, said first buffer storage storing the work to be transferred therebetween;
   a second buffer storage being located between said processing chamber and said second load lock chamber, said second buffer storage storing the work to be transferred therebetween;
   means for moving the work from one of the stages to a next stage, said means for moving being turned to move the work in order;
   means for transferring the work between said first buffer storage and said means for moving and between said second buffer storage and said means for moving; and.
   a carrier holding the work,
   wherein the work is conveyed and transferred together with the carrier.

2. The substrate processing apparatus according to claim 1, wherein each of said load lock chambers has a first open-close plate, which is opened when the work is fed into and carried out from said load lock chamber and which is air-tightly closed when inner pressure of said load lock chamber is reduced, and
   a second open-close plate is provided between each of said load lock chambers and each of said buffer storages, said second open-close plate is opened when said load lock chamber reaches prescribed degree of vacuum so as to convey the work between said load lock chamber and said buffer storage.

3. The substrate processing apparatus according to claim 1, wherein said first load lock chambers has means for heating the work.

4. The substrate processing apparatus according to claim 1, wherein said first load lock chambers has means for cooling the work.

5. The substrate processing apparatus according to claim 1, wherein a holder, which holds a plurality of works, are respectively set in said load lock chambers and said buffer storages, and
   said substrate processing apparatus further comprises means for collectively conveying the works between the holder of each of said load lock chambers and the holder of each of said buffer storages.

6. The substrate processing apparatus according to claim 1, wherein a holder, which holds a plurality of works, are respectively set in said load lock chambers and said buffer storages,
   each of said buffer storages has a mechanism for elevating the holder, and
   said substrate processing apparatus further comprises a mechanism for transferring the works between the holder, which is supported by the elevating mechanism, and a transferring stage of said processing chamber.

7. The substrate processing apparatus according to claim 6, wherein the transferring mechanism includes a hand, which is reciprocally moved between each of said buffer storages and the transferring stage.

8. The substrate processing apparatus according to claim 6, wherein the transferring mechanism includes:
   a first arm transferring the works between said first buffer storage and said second buffer storage; and
   a second arm transferring the works between said second buffer storage and the said second transferring stage.

9. The substrate processing apparatus according to claim 1, wherein the carrier has a planar shape formed into a trapezoid, and
   the narrow side of the trapezoid faces the center of said processing chamber when the carrier is transferred into said processing chamber.

10. The substrate processing apparatus according to claim 1,
wherein said processing chamber includes the processing stage for processing the work and a transferring stage for transferring the work, and
the work is moved between the processing stage and the transferring stage by said means for moving, which includes rotary arms, whose number is equal to that of the stages, and a mechanism for rotating the rotary arms.

11. The substrate processing apparatus according to claim 10,
wherein the rotating mechanism includes an elevating mechanism, which moves the rotary arms between an upper position, which is located above setting plates of the stages for conveying the work, and a lower position, which is located under the setting plates for setting the work onto the setting plates.

12. The substrate processing apparatus according to claim 1,
wherein said processing chamber includes the processing stage for processing the work and a transferring stage for transferring the work, and
the work is moved between the processing stage and the transferring stage by said means for moving, which includes a turn table for supporting the work and a mechanism for rotating the turn table.

13. The substrate processing apparatus according to claim 1, wherein each lock chamber is spaced radially outwardly from the processing chamber, the buffer storage located between the processing chamber and the lock chamber.

14. A substrate processing apparatus, comprising:
a processing chamber including a plurality of stages, including a processing stage in which a work is processed, the plurality of stages arranged at regular intervals in a circumferential direction;
a first load lock chamber for feeding the work, said first load lock chamber being communicated to said processing chamber;
a second load lock chamber for carrying out the work, said second load lock chamber being communicated to said processing chamber;
a first buffer storage being located between said processing chamber and said first load lock chamber, said first buffer storage storing the work to be transferred therebetween;
a second buffer storage being located between said processing chamber and said second load lock chamber, said second buffer storage storing the work to be transferred therebetween;
means for moving the work from one of the stages to a next stage, said means for moving being turned to move the work in order;
means for transferring the work between said first buffer storage and said means for moving and between said second buffer storage and said means for moving;
wherein said processing chamber includes the processing stage for processing the work and a transferring stage for transferring the work;
the work is moved between the processing stage and the transferring stage by said means for moving, which includes a turn table for supporting the work and a mechanism for rotating the turn table; and,
wherein pins are provided to the turn table, and
the pins are collectively moved between upper positions, at which the pins are upwardly projected from the turn table to support the work for transferring the work, and lower positions, at which the pins are retracted in the turn table for setting the work, by an elevating mechanism.

* * * * *